(12) United States Patent
Taylor et al.

(10) Patent No.: US 6,465,350 B1
(45) Date of Patent: Oct. 15, 2002

(54) ALUMINUM NITRIDE THIN FILM FORMATION ON INTEGRATED CIRCUITS

(75) Inventors: Kelly J. Taylor, Allen; Wei-Yan Shih, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 09/689,077

(22) Filed: Oct. 12, 2000

Related U.S. Application Data

(60) Provisional application No. 60/167,783, filed on Nov. 29, 1999.

(51) Int. Cl.[7] .................................................. H01L 21/44

(52) U.S. Cl. ..................... 438/688; 438/627; 438/629; 438/637; 438/672; 438/675; 438/643; 438/660

(58) Field of Search ................................ 438/624–629, 438/636–640, 687, 688, 672, 673, 675, 701, 713, 642, 643, 660

(56) References Cited

U.S. PATENT DOCUMENTS

| | | | |
|---|---|---|---|
| 4,865,830 A | * | 9/1989 | Klabunde et al. ............ 423/412 |
| 5,990,011 A | * | 11/1999 | McTeer ....................... 438/692 |
| 6,106,898 A | * | 8/2000 | Takamatsu ............. 427/255.21 |
| 6,207,568 B1 | * | 3/2001 | Liu et al. ..................... 438/688 |
| 6,211,066 B1 | * | 4/2001 | Stumborg et al. ........... 438/627 |
| 6,218,283 B1 | * | 4/2001 | Park et al. ................... 438/622 |
| 6,280,640 B1 | * | 8/2001 | Hurwitz et al. ................ 216/15 |

FOREIGN PATENT DOCUMENTS

JP   355018041 A  *  2/1980

* cited by examiner

Primary Examiner—Carl Whitehead, Jr.
Assistant Examiner—Khanh Duong
(74) Attorney, Agent, or Firm—Jacqueline J. Garner; W. James Brady, III; Frederick J. Telecky, Jr.

(57) ABSTRACT

A method for forming a thin aluminum-nitride film (112). Solid hydrazine cyanurate is heated to produce in-situ hydrazine ($N_2H_4$). The in-situ hydrazine reacts with a previously deposited ailminum layer (108) to form aluminum-nitride (112).

10 Claims, 2 Drawing Sheets

ALUMINUM NITRIDE THIN FILM FORMATION ON INTEGRATED CIRCUITS

This application claims priority under 35 USC §119(e)(1) of provisional application No. 60/167,783 filed Nov. 29, 1999.

CROSS-REFERENCE TO RELATED APPLICATIONS

The following co-pending applications are related and hereby incorporated by reference:

| Ser. No. | Filing Date | Inventors |
| --- | --- | --- |
| 09/689,079 | 10/12/2000 | Brankner et al. |
| 09/689,034 | 10/12/2000 | Luttmer et al. |

FIELD OF THE INVENTION

The invention is generally related to the field of forming aluminum nitride layers in semiconductor devices.

BACKGROUND OF THE INVENTION

Aluminum nitride layers are used in a variety of applications in semiconductor devices. Aluminum nitride can be used as a liner in shallow trench applications. In multilevel interconnects, the metal layers are sometimes cladded with aluminum nitride. Aluminum nitride has also been used as an antireflective coating.

There are several common methods for forming aluminum nitride. One common method is sputter deposition. RF sputtering from $Al_2O_3$ targets or Al targets in an $N_2$ ambient is used to deposit AlN on the surface of a structure. Another method used to form aluminum nitride is plasma-enhanced chemical vapor deposition (PECVD). Triamino alane and $N_2$ are used in the PECVD process to deposit aluminum nitride on the surface. Extremely high temperatures (e.g., >1400° C.) an also form AlN directly from $Al_2O_3$ in the presence of carbon, hydrogen, and nitrogen.

As the density of semiconductor devices increases, the demands on interconnect layers for connecting the semiconductor devices to each other also increases. In a conventional interconnect process, the aluminum (and any barrier metals) are deposited, patterned, and etched to form the interconnect lines. A diffusion barrier layer, such as $SiO_2$ or SiN, is then deposited over the interconnect lines to prevent diffusion of impurities.

After the dielectric liner is deposited, an interlevel dielectric (ILD) is formed between the interconnect lines. In order to meet the performance demands (i.e., reduced capacitance) of the interconnect lines, spin-on low dielectric constant (low-k) materials and vapor deposited dielectrics are being employed in at least a portion of the ILD. Low-k materials are generally defined as those materials having a dielectric constant below that of silicon dioxide.

There is a desire to decrease the spacing between interconnect lines as the semiconductor devices become more dense. The deposited dielectric diffusion barrier on the sidewalls of the aluminum interconnect lines further reduces the spacing between interconnect lines. This, in turn, reduces the amount of low-k material that can be used for gap fill between the interconnect lines. Accordingly, a thinner diffusion barrier is desired.

SUMMARY OF THE INVENTION

The invention is a method of forming an aluminum nitride thin film in an integrated circuit. A thin aluminum nitride layer is formed at the surface of an aluminum layer using hydrazine synthesized from hydrazine cyanurate.

An advantage of the invention is providing an aluminum nitride thin film with a less hazardous process.

This and other advantages will be apparent to those of ordinary skill in the art having reference to the specification in conjunction with the drawings.

DETAILED DESCRIPTION OF THE EMBODIMENTS

The invention uses the synthesis of in-situ hydrazine from hydrazine cyanurate (HC) to form aluminum nitride (AlN). The invention will be described in conjunction with an aluminum metal interconnect. It will be apparent to those of ordinary skill in the art that the benefits of forming an aluminum-nitride layer according to the invention may be applied at other steps in the semiconductor fabrication process, such as liners for shallow trench isolation and anti-reflective coatings for various patterning steps.

Figure 1:
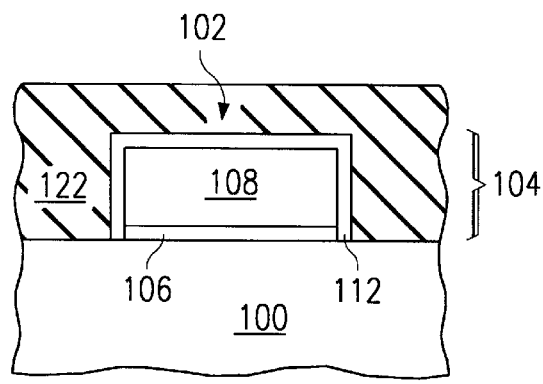
FIG. 1 is a cross-sectional diagram of an interconnect layer according to the invention.

An interconnect line 102 according to an embodiment of the invention is shown in FIG. 1. Interconnect line 102 is formed on a semiconductor body 100.

As is known in the art, semiconductor body 100 may comprise a substrate with transistors and other devices formed therein. Interconnect line 102 may be part of the first or any subsequent interconnect layer. Interconnect layer 104 comprises a plurality of interconnect lines 102.

Each interconnect line 102 may comprise one or more underlying barrier layers 106. In a preferred embodiment of the invention, barrier layer 106 comprises a Ti/TiN stack. Many other barrier layers and combinations of barrier layers are known in the art and may be used in conjunction with the invention.

The thickness of barrier layer 106 may vary depending on the technology node and process employed. As an example, the thickness may be less than 1500Å.

Each interconnect line 102 also comprises an aluminum-based metal 108 on the barrier layer 106. For example, Al alloys such as Al—Cu alloys may be used. Suitable aluminum-based metals are also well known in the art. The thickness of metal 108 may vary depending on the technology node and process employed. As an example, the thickness may be on the order of 5000Å.

At the surface (including the sidewalls) of interconnect line 102 is a thin aluminum-nitride (AlN) layer 112. AlN layer 112 is formed by reaction of aluminum alloy (metal 108) with HC. AlN layer 112 serves as a diffusion barrier for metal 108 along with barrier layer 106. Layer 112 has a thickness on the order of 100Å. An AlN layer formed using hydrazine (from HC) has the advantage over rf-sputtered AlN or PECVD AlN (with triamino alane and $N_2$) of a more conformal deposition. For a given sidewall coverage, the total film deposition amount is less using a reaction of aluminum alloy with hydrazine. Furthermore, $Al_2O_3$ is known to have better electromigration (EM) performance than Ti/TiN barriers.

Figure 3:
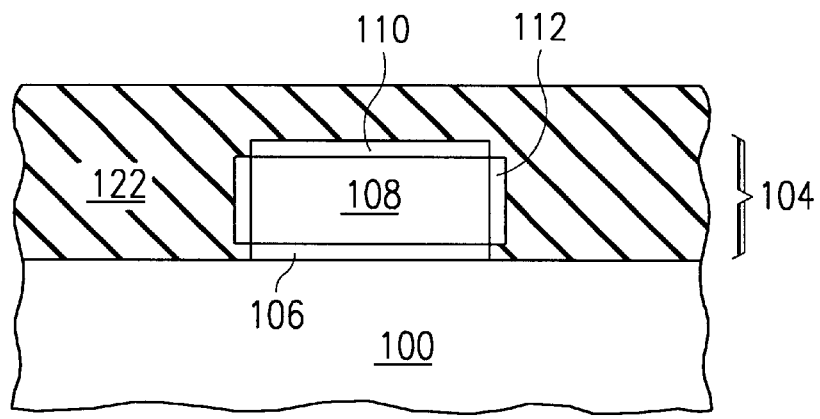
FIG. 3 is a cross-sectional diagram of an interconnect layer having a top barrier formed according to the invention.

Prior art metal interconnects lines typically comprise a top barrier layer. However, the AlN layer 112 of the invention allows the top barrier layer to be eliminated if desired. AlN layer 112 is only formed over exposed aluminum. Therefore, if an optional top barrier 110 is used, AlN layer 112 will only be formed on the sidewalls of metal lines 108, as shown in FIG. 3.

Figures 2A, 2B:
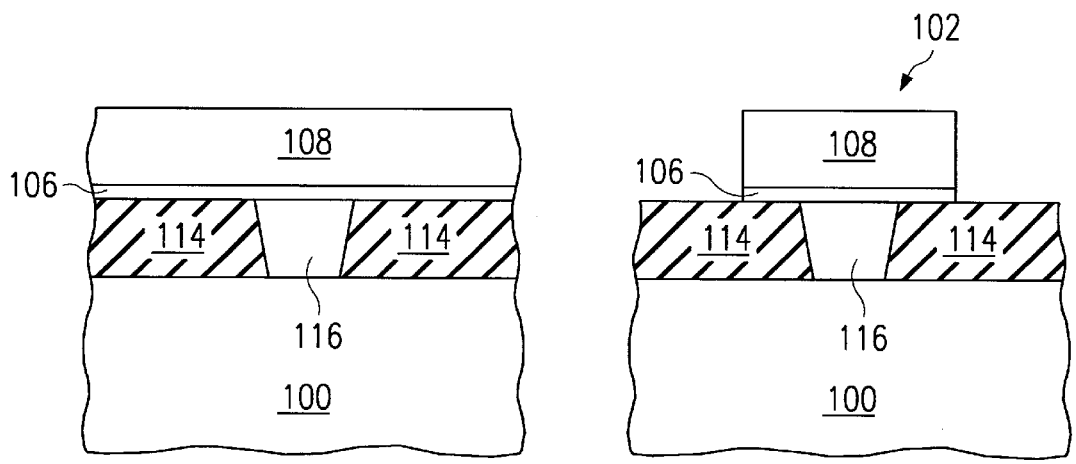
FIGS. 2A–2D are cross-sectional diagrams of the interconnect layer of FIG. 1 at various stages of fabrication.

A method of forming interconnect line 102 will now be discussed with reference to FIGS. 2A–E. Semiconductor body 100 is processed through the formation of interlevel dielectric 114 including the formation of isolation structures (not shown), transistors (not shown) and other devices (also not shown) as is known in the art. Semiconductor body 100 may also have been processed through the formation of one or more interconnect layers. Interlevel dielectric (ILD) 114 may also have vias or contacts 116 formed therein for connecting interconnect line 102 to transistors, devices, or other interconnect lines. Referring to FIG. 2A, barrier layer 106 is deposited over ILD 114 including over via/contact 116. Many suitable barrier layers are known in the art. As an example, barrier layer 106 may comprise a Ti/TiN stack having a thickness less than 1500Å. A metal 108 is deposited over barrier layer 106. Metal 108 comprises an aluminum-based material. For example, an AlCu alloy having a thickness on the order of 5000Å may be used. If an overlying barrier layer is desired, it may be deposited over metal 108. Suitable materials for overlying barrier layer are also known in the art. For example, overlying barrier layer may comprise TiN having a thickness of less than 500Å. The remaining discussion assumes no overlying barrier layer is utilized.

Referring to FIG. 2B, metal 108 and barrier layer 106 are patterned and etched to form interconnect lines 102. Suitable etches are well known in the art. Standard cleanup processes are then performed.

Figures 2C, 2D:
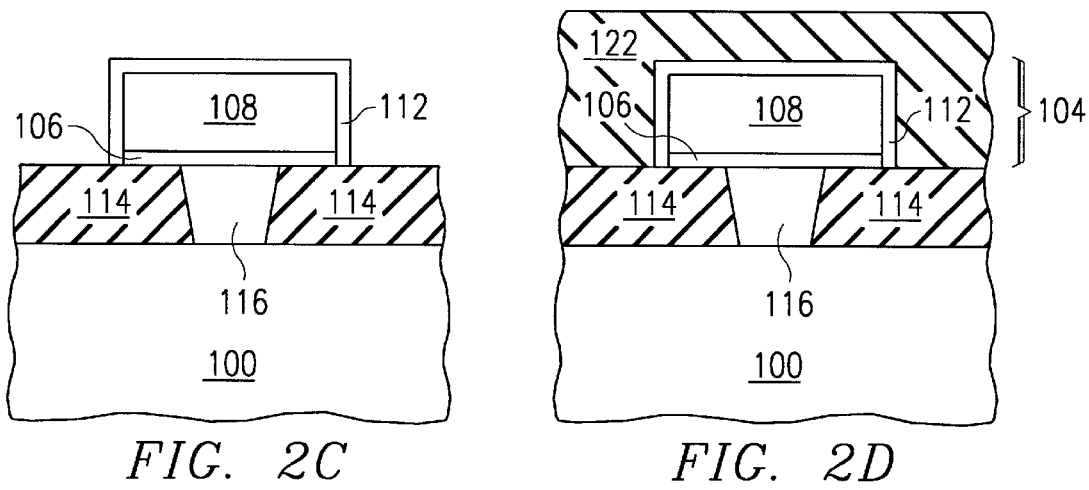

Referring to FIG. 2C, AlN layer 112 is formed over metal 108. Hydrazine ($N_2H_4$) synthesized from hydrazine cyanurate is used to form AlN layer 112 from freshly deposited aluminum 108. Although the use of liquid hydrazine has been restricted due to safety and purity reason, hydrazine cyanurate (HC) is a stable solid complex of $N_2H_4$ that can easily be handled and purified before use. Pure $N_2H_4$ may be created by heating HC. Processes for synthesizing HC are known in the art. (See, e.g., *Hydrazine cyanurate as a nitrogen source for thin nitride film growth* by Kropewnicki et al, J. Vac. Sci. Technol. a 16(1), January/February 1998 incorporated herein by reference.) Kropewnicki et al teach forming HC as follows: (1) add 320 ml of deionized $H_2O$ and 12.93 grams of CA to a round bottom flask kept under a $N_2$ atmosphere; (2) magnetically stir the contents while heating to 100° C.; (3) add 3.4 ml of anhydrous liquid $N_2H_4$ from an inert atmosphere dry box to form HC crystals; (4) dry the crystals in a Buchner funnel (excess solvent is poured into a 5% NaHClO aqueous solution to neutralize any residual $N_2H_4$); (5) vacuum dry the solid HC at 120° C. and a pressure of less than $10^{-3}$ Torr. Improved results are obtained when a dimethylsulfoxide (DMSO) is used in place of the $H_2O$.

To form AlN layer 112, the wafer is placed in a CVD chamber. For example, a low pressure CVD (LPCVD) chamber may be used. The wafer and HC, formed according to methods known in the art, are heated. HC is heated at least to its activation temperature. The activation temperature varies depending on the method used to fabricate the HC. For HC synthesized with $H_2O$ the activation temperature is under 200° C. For HC synthesized using DMSO, the activation temperature is above 200° C. When heated to at or above its activation temperature, pure $N_2H_4$ is evolved.

The evolved $N_2H_4$ is supplied to the process chamber. The hydrazine reacts with the metal 108 surface to form AlN layer 112, as shown in FIG. 2C. The reaction is reported to be first order with temperature. Therefore, the higher the temperature, the better. However, when processing integrated circuits, it is usually desirable to maintain a temperature at or below 450° C. The pertinent chemical reaction between hydrazine and aluminum is:

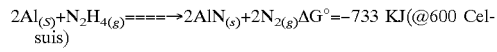
$$2Al_{(s)} + N_2H_{4(g)} \longrightarrow 2AlN_{(s)} + 2N_{2(g)} \Delta G° = -733 \text{ KJ} (@600 \text{ Celsius})$$

compared to −541 KJ/mol for an ammonia-based process. (Ammonia-based processes generally utilize a plasma when an aluminum-nitride layer is desired.) The Standard Gibb's free-energy difference between $NH_3$ and hydrazine $N_2H_4$ is 175 KJ/mol. Thus, a more favorable thermodynamic situation is expected when hydrazine replaces $NH_3$ in a reaction.

A process to reduce $Al_2O_3$, which is always present in air-exposed aluminum, is more favored by a hydrazine-based process when compared to the ammonia-based process (i.e., less endothermic):

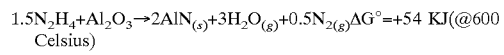
$$1.5N_2H_4 + Al_2O_3 \rightarrow 2AlN_{(s)} + 3H_2O_{(g)} + 0.5N_{2(g)} \Delta G° = +54 \text{ KJ} (@600 \text{ Celsius})$$

compared to $\Delta G° = +260$ KJ for the $NH_3$ process.

An intermediate step reduction of $Al_2O_3$ with hydrogen or nitrogen plasma may be used to ensure the reaction, although the non-equilibrium conditions in a chemical vapor deposition (CVD) class reactor frequently allows some reactions to proceed which are not thermodynamically favorable. A plasma, for example in a plasma-enhanced CVD (PECVD) chamber, may be used to generate hydrogen or nitrogen ions that will easily reduce the aluminum:

$$3H_2^+ + Al_2O_3 == \rightarrow 2Al + 3H_2O \quad \Delta G° = -3618 \text{ KJ} (@600 \text{ Celsius})$$

$$3N_2^+ + Al_2O_3 == \rightarrow 2Al + 3N_2O \quad \Delta G° = -2650 \text{ KJ} (@600 \text{ Celsius})$$

After forming AlN layer 112, intrametal dielectric (IMD) 122 is formed between interconnect lines 102, as shown in FIG. 2D. The invention is especially appropriate for IMD layers that comprise, at least in part a low-k dielectric material because it allows for more of the gapfilling material to be a low-k material. This is due to the fact that the higher-k oxide liner is avoided. For example, low-k dielectrics such as FSG (fluorine doped silicate glass) or HSQ (hydrogen silesquixane). AlN layer 112 is able to prevent corrosion of the metal lines 102 during the application, curing and annealing of the IMD.

The above process may be repeated for subsequent metal interconnect layers. The invention may be applied to one or more (or all) of the interconnect layers of an integrated circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

Figure 4:
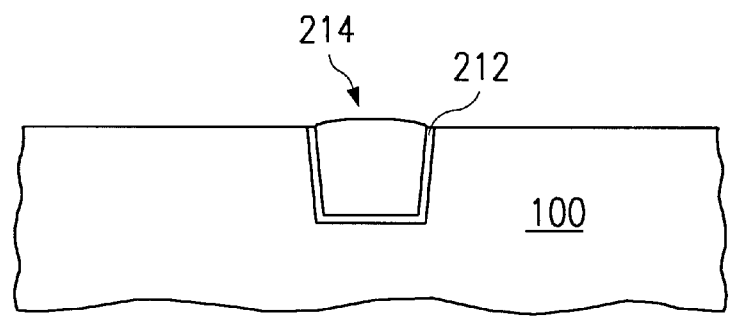
FIG. 4 is a cross-sectional diagram of an aluminum nitride layer formed according to the invention used as a liner for a shallow trench.
Figure 5:
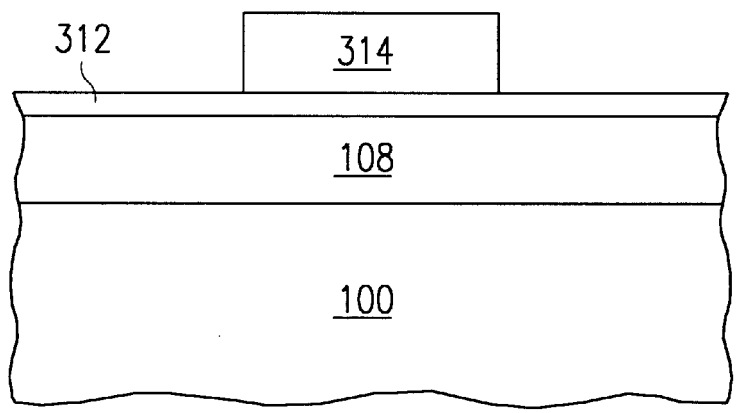
FIG. 5 is a cross-sectional diagram of an aluminum nitride layer formed according to the invention used as an antireflective coating for photolithography.

For example, an AlN layer 212 formed according to the invention, may be used for a liner in shallow trench isolation 214 as shown in FIG. 4 or as an antireflective coating 312 for photo lithography (forming photoresist patterns 314) as shown in FIG. 5. It is therefore intended that the appended claims encompass any such modifications or embodiments.

What is claimed is:

1. A method for forming an integrated circuit, comprising the steps of:

forming an aluminum-based metal layer over a semiconductor body;

synthesizing hydrazine from hydrazine cyanurate; and subjecting a surface of said aluminum-based metal layer to said hydrazine to form an aluminum-nitride layer at said surface.

2. The method of claim 1, further comprising the steps of:

forming a first barrier layer over the semiconductor body prior to forming said aluminum-based metal layer; and patterning and etching said first barrier layer and said aluminum-based metal layer to form a metal interconnect line.

3. The method of claim 2, further comprising the step of depositing a second barrier layer over said aluminum-based metal layer prior to said patterning and etching step, wherein said subjecting step forms said aluminum-nitride layer on a sidewall of said aluminum-based metal layer.

4. The method of claim 1, wherein said step of forming an aluminum-based metal layer comprises the steps of:

forming a shallow trench in said semiconductor body; and forming said aluminum-based metal layer within said shallow trench including on a plurality of sidewalls of said shallow trench.

5. The method of claim 1, further comprising the steps of:

forming a layer of resist over said aluminum-nitride layer; and creating a pattern from said layer of resist using said aluminum-nitride layer as an antireflective coating.

6. The method of claim 1, further comprising the step of subjecting an aluminum oxide material at the surface of said aluminum-based metal layer to a plasma to reduce said aluminum oxide material to aluminum prior to said step of subjecting said surface of said aluminum-based metal layer to said hydrazine.

7. The method of claim 6, wherein said plasma is used to generate nitrogen ions to reduce said aluminum oxide material.

8. The method of claim 6, wherein said plasma is used to generate hydrogen ions to reduce said aluminum oxide material.

9. A method for forming an integrated circuit, comprising the steps of:

forming a metal layer comprising aluminum over a semiconductor body;

synthesizing hydrazine from hydrazine cyanurate, wherein said synthesizing step comprises heating said hydrazine cyanurate; and subjecting a surface of said metal layer to said hydrazine to form an aluminum-nitride layer over said metal layer.

10. A method for forming an integrated circuit, comprising the steps of:

forming a metal layer comprising aluminum over a semiconductor body;

synthesizing hydrazine from hydrazine cyanurate; and subjecting a surface of said metal layer to said hydrazine to form an aluminum-nitride layer over said metal layer, wherein said subjecting step comprises the step of heating said semiconductor body to a temperature on the order of 300° C.

\* \* \* \* \*